(12) United States Patent
Nishimoto et al.

(10) Patent No.: US 7,145,633 B2
(45) Date of Patent: Dec. 5, 2006

(54) APPARATUS AND METHOD OF EXPOSING LIGHT TO A SEMICONDUCTOR DEVICE HAVING A CURVED SURFACE

(75) Inventors: Ikuo Nishimoto, Kanagawa (JP); Nobuo Takeda, Miyagi (JP); Ichitaroh Satoh, Tokyo (JP)

(73) Assignee: Yamatake Corporation, Tokyo (JP)

( * ) Notice: Subject to any disclaimer, the term of this patent is extended or adjusted under 35 U.S.C. 154(b) by 0 days.

(21) Appl. No.: 10/538,980

(22) PCT Filed: Jan. 9, 2003

(86) PCT No.: PCT/US03/00579

§ 371 (c)(1),
(2), (4) Date: Jun. 14, 2005

(87) PCT Pub. No.: WO2004/063813

PCT Pub. Date: Jul. 29, 2004

(65) Prior Publication Data

US 2006/0050343 A1    Mar. 9, 2006

(51) Int. Cl.
G03B 27/58    (2006.01)
G03B 27/48    (2006.01)
G03B 27/32    (2006.01)
G03F 1/00     (2006.01)
G03C 5/00     (2006.01)
G06F 19/00    (2006.01)

(52) U.S. Cl. ............. 355/47; 355/48; 355/72; 355/77; 430/5; 430/311; 700/121

(58) Field of Classification Search ............ 355/47, 355/48, 49, 53, 72, 77; 430/5, 311; 700/121
See application file for complete search history.

(56) References Cited

U.S. PATENT DOCUMENTS

| | | | |
|---|---|---|---|
| 3,573,045 A | 3/1971 | Lemelson | |
| 4,102,734 A | 7/1978 | Schiffman | |
| 5,955,776 A | 9/1999 | Ishikawa | |
| 6,027,863 A * | 2/2000 | Donadio, III | 430/320 |
| 6,061,118 A | 5/2000 | Takeda | |
| 6,069,682 A | 5/2000 | Ishikawa | |
| 6,097,472 A | 8/2000 | Takanaka et al. | |
| 6,130,742 A | 10/2000 | Kanatake | |
| 6,136,617 A | 10/2000 | Kanatake | |
| 6,245,630 B1 | 6/2001 | Ishikawa | |
| 6,251,550 B1 | 6/2001 | Ishikawa | |
| 6,251,765 B1 | 6/2001 | Fukano et al. | |
| 6,265,234 B1 | 7/2001 | Mei | |
| 6,300,020 B1 | 10/2001 | Ina et al. | |

(Continued)

*Primary Examiner*—Alan Mathews
(74) *Attorney, Agent, or Firm*—Robert D. Atkins; Quarles & Brady Streich Lang LLP

(57) ABSTRACT

A semiconductor manufacturing station (50) exposes light on a surface area of a spherical semiconductor device or ball (52). A mask pattern generator (56) provides a pattern of light, which undergoes temporal changes to collectively represent an image. The mask pattern generator has an active exposure contour (80) that provides a portion of the overall image. The pattern of light is directed though a lens (62) to the surface area of the semiconductor device. The semiconductor device rotates in relation to the temporal changes in the pattern of light to expose the pattern of light over a portion of a surface area of the semiconductor device. The exposure contour has a narrower center and becomes wider moving away from the center. The exposure contour may have a curvature.

22 Claims, 6 Drawing Sheets

U.S. PATENT DOCUMENTS 6,453,458 B1 * 9/2002 Fukano et al. ................. 716/21
6,498,643 B1 * 12/2002 Mei et al. .................... 356/244
6,529,262 B1 * 3/2003 Mei et al. ..................... 355/47

* cited by examiner

APPARATUS AND METHOD OF EXPOSING LIGHT TO A SEMICONDUCTOR DEVICE HAVING A CURVED SURFACE

CLAIM TO DOMESTIC PRIORITY

This application is a U.S. National Stage Application filed under 35 U.S.C. 371 claiming priority from the International Application No. PCT/US2003/000579, filed Jan. 9, 2003, which application is incorporated herein by reference.

FIELD OF THE INVENTION

Background of the Invention

Semiconductor devices are commonly used in many types of electronic products. The manufacturing of a semiconductor device typically involves growing a cylindrical-shaped silicon (or other base semiconductive material) ingot. The ingot is sliced into circular flat wafers. Through a number of thermal, chemical, and physical processes, including diffusion, oxidation, epitaxial growth, ion implantation, deposition, etching, sputtering, polishing, and cleaning active semiconductor devices and passive devices are formed on one or both surfaces of the wafer. The wafer is cut into individual rectangular semiconductor die which are then mounted and attached to a leadframe, encapsulated, and packaged as discrete or integrated circuits. The packaged discrete and integrated circuits are mounted to a printed circuit board and interconnected to perform the desired electrical function.

Another type of semiconductor device, known as a spherical-shaped semiconductor device or ball, has emerged in the industry to offer a number of advantages over flat semiconductor wafers and rectangular semiconductor die. The manufacture of the semiconductor ball is disclosed in U.S. Pat. No. 5,955,776. The semiconductor ball is manufactured using less complex and less expensive equipment as compared to wafer-type semiconductor manufacturing. The physical characteristics of the semiconductor ball provides for easy transport through pipes and tubes filled with a gaseous or fluid medium, which reduces the need for expensive, large scale, open clean rooms. The enclosed transport reduces the potential for exposure to contaminants, which reduces defects and increases the production yield.

A typical semiconductor ball has a diameter of 1.0 millimeters (mm) or less and may contain active semiconductor devices and passive devices over virtually its entire surface area. The spherical shape increases both the useable area of the semiconductor device and the device integration density for a given footprint. The semiconductor ball may interconnect to a printed circuit board, or to other semiconductor balls, at any location on its surface thereby reducing, simplifying, and adding flexibility to the interconnect layout. The flexible interconnect allows for three dimensional clustering of the semiconductor balls each having multiple active layers and multiple metal layers in any direction. The spherical shape of the semiconductor ball provides structural strength and integrity such that conventional assembly and packaging become unnecessary in some applications.

The semiconductor ball undergoes a variety of conventional thermal, chemical, and physical processing steps during manufacture. Several of the processing steps involve exposure of the semiconductor ball to a light source. For example, an etching process to selectively remove semiconductor material involves application of a photoresist material to a surface area. A mask is positioned above the surface area and exposed to a light source. The pattern in the mask either blocks the light or allows it to pass to the semiconductor surface area. Accordingly, portions of the surface area of the semiconductor ball are exposed to the light according to the mask pattern. The photoresist on those portions of the surface area that are exposed to light is polymerized. The photoresist on those portions of the surface area that are not exposed to light is not polymerized. The mask is removed and the photoresist is developed to remove the non-polymerized photoresist. A solution of nitric and hydrofluoric (HF) acid is applied the surface area to etch away the material which had been under the non-polymerized photoresist. The polymerized photoresist and the underlying material remain. The photoresist etch process may also be configured to operate in the opposite mode.

For conventional semiconductor wafers, the light exposure incident to its flat surface is relatively uniform and even. On the other hand, the exposure of light to a curved surface such as found on a spherical semiconductor ball presents a number of challenges to the manufacturing process. In general, it is impractical to cover the entire surface of the semiconductor ball with one mask pattern. Moreover, it is difficult to focus the light uniformly over a significant portion of the curved surface of a spherical body. If the focus of the light source is directed to one focal point on the curved surface, then the rest of the pattern image diminishes, blurs, or distorts on the curved surface moving away from the focal point. The exposure of light to a curved surface results in a non-uniform distribution of the light and non-uniform focus and clarity of the projected image radially from the focal point. In addition, the light incident to the focal point on the curved surface normal to the direction of the light path will have a stronger intensity than a second point on the curved surface some distance from the focal point. The light striking the second point will have an angle of incidence less than 90° and consequently a lower intensity. In the etching process, the photoresist on the surface area exposed to a lower intensity light will develop at a different rate than the photoresist on the surface area exposed to a higher intensity light.

For example, as shown in prior art FIG. 1, a light from light source 10 is incident to mask 12. Mask 12 projects a pattern or image by the transmitted and non-transmitted portions of the light through mask 12, which is then focused by lens 14 to a focal point 16 on the surface of semiconductor ball 18. The spherical shape of semiconductor ball 18 causes the pattern to blur or distort and become larger in the radial direction from focal point 16. Circle 20 represents the surface area of semiconductor ball 18, centered about focal point 16, where the mask pattern image is relatively sharp and clear without appreciable distortion or degradation. Area 22 represents the portion of the surface area of semiconductor ball 18 where the mask pattern image is appreciably distorted or degraded, given that the light is focused at focal point 16.

Assume a distance r1 from focal point 16 to the outer perimeter of circle 20 and a distance r2 from focal point 16 to the edge of the plane defined by lines 24. The distance d1 represents the difference between the light path from lens 14 to focal point 16 and the light path from lens 14 to a point at r1. The distance d2 represents the difference between the light path from lens 14 to focal point 16 and the light path from lens 14 to a point at r2. The ratio d2:d1 becomes large as the ratio r2:r1 increases due to the curvature of the surface of semiconductor ball 18. The distortion of the light exposure for surface areas of semiconductor ball 18 less than distance d1 is considered within acceptable limits. The distortion of light exposure for surface area of semiconductor ball 18 greater than distance d1, i.e. area 22, is outside the acceptable limits.

The distortion of light exposure within area 22 of FIG. 1 reduces the accuracy of the mask pattern image and could result in defects in the devices formed on semiconductor ball 18 in that area. The lack of resolution in the light exposure also makes it difficult to design high quality, high density circuits over continuous areas with the requisite precision in focal quality of the light exposure. As the integration density increases and the mask patterns become more elaborate, it is difficult to form minute circuits on the curved surface of semiconductor ball 18 near the edges of circle 20. Another problem is found in forming continuous circuits such as integrated inductors and coils. The joints between adjacent exposable circles like 20 do not match well which increases the resistance at the joints and degrades the intended function.

One solution is to reduce the pattern size relative to the surface area of semiconductor ball 18 and thereby reduce the distortion effects. Semiconductor ball 18 is divided into a number of plane surfaces, each with a center focal point. Line 24 in FIG. 1 defines one such plane centered at focal point 16. Each plane surface is made small enough to provide a distortion-free mask pattern image, or at least one with acceptable distortion, over the majority of its surface area. However, such a solution requires more total exposures to cover the required surface area and possible re-alignment of semiconductor ball 18 for each exposure, adding the manufacturing processing time.

A need exists for an optical exposure system that allows light to be uniformly exposed across the surface area of a curved object.

DETAILED DESCRIPTION OF THE DRAWINGS

Figure 1:
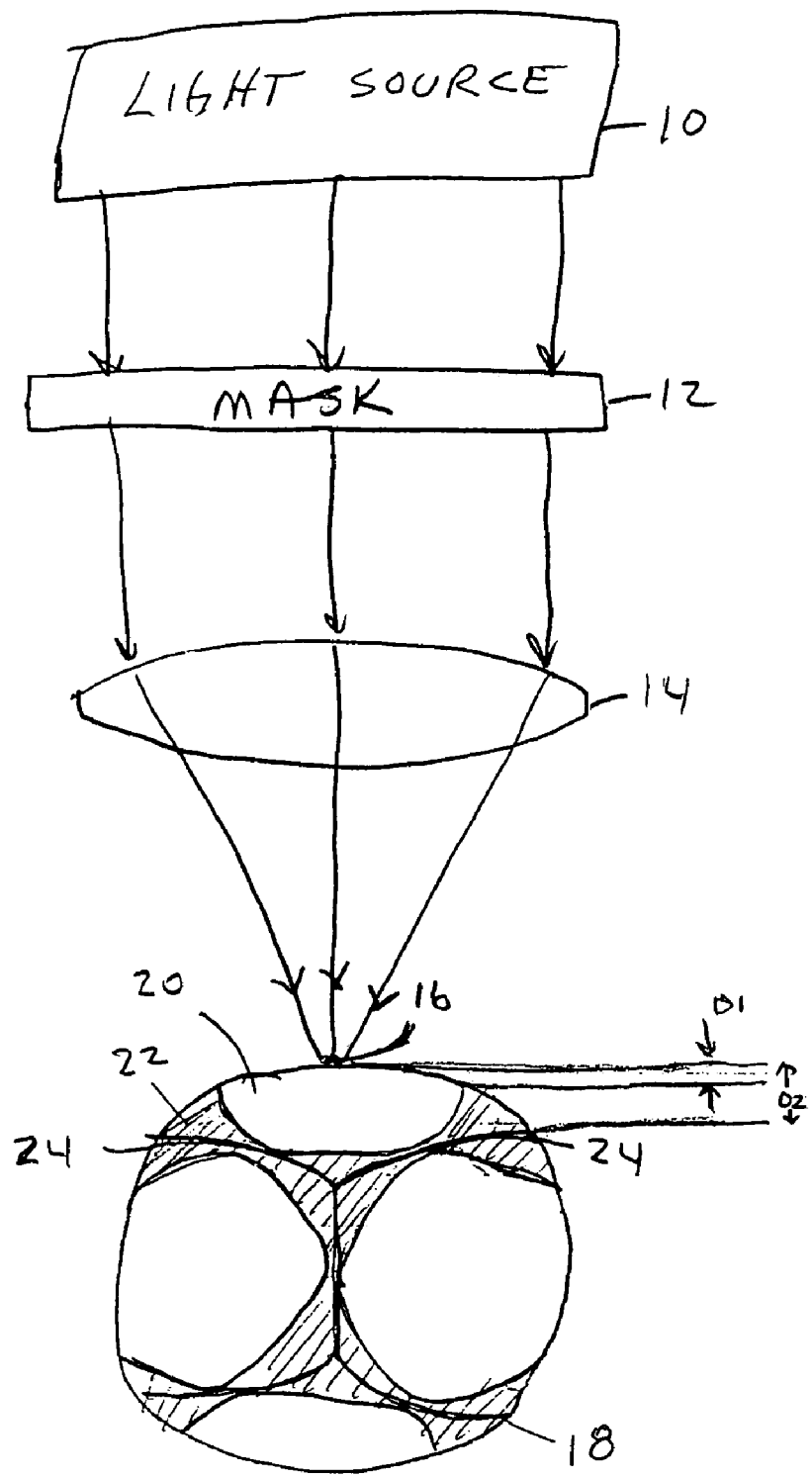
FIG. 1 is a semiconductor light exposure system as found in the prior art.
Figure 2:
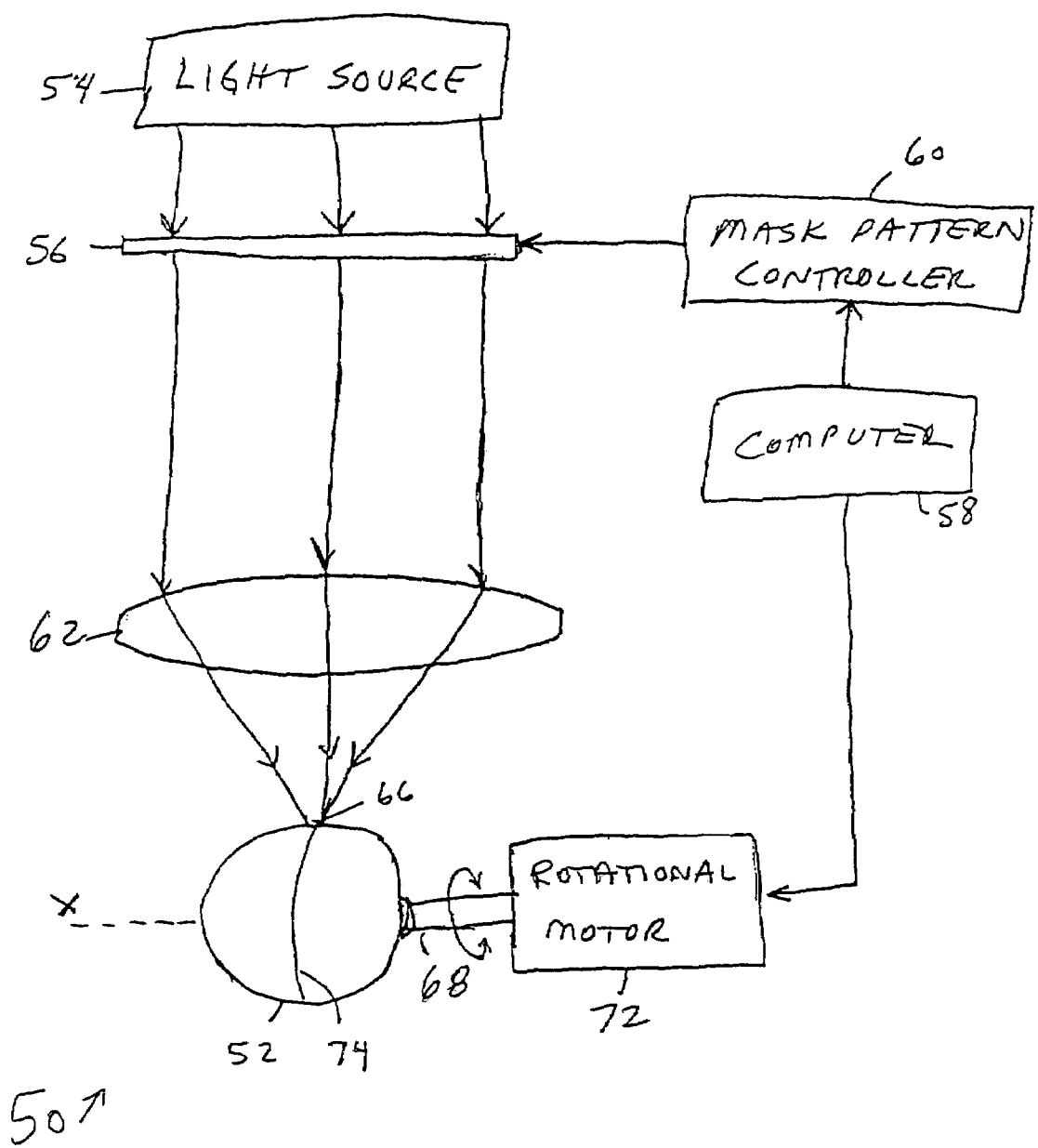
FIG. 2 is a semiconductor manufacturing system for exposing light on the semiconductor ball.

A semiconductor manufacturing system or station 50 is shown in FIG. 2 for exposing light on a spherical semiconductor device or ball 52, or other spherical shaped object, or object having a curved surface. Semiconductor ball 52 may contain active semiconductor devices, such as transistors and diodes, and passive devices, such as resistors and capacitors, over any part or substantially all of its surface area. The manufacture of semiconductor ball 52 is disclosed in U.S. Pat. No. 5,955,776 and incorporated herein by reference. Semiconductor ball 52 has the ability to interconnect to a printed circuit board, or to other semiconductor balls, at virtually any location on its surface, which reduces and simplifies the interconnect layout. The flexible interconnect allows for three dimensional clustering of the semiconductor balls each having multiple active layers and multiple metal layers in any direction. The spherical shape of semiconductor ball 52 provides a structural strength and integrity such that conventional assembly and packaging become unnecessary in some applications.

Semiconductor ball 52 undergoes a variety of thermal, chemical, and physical processes, including diffusion, oxidation, epitaxial growth, ion implantation, deposition, etching, sputtering, polishing, and cleaning, during manufacturing to form the active semiconductor devices and passive devices on its surface. Several of the manufacturing process steps involve exposure of semiconductor ball 52 to a light source. One such manufacturing step is an etching process wherein a photoresist layer is applied to a portion of the surface of semiconductor ball 52. Certain areas of the photoresist layer are exposed to a light source, while other areas of the photoresist layer are not exposed to the light source, as determined by a mask filter. The photoresist material that is exposed to the light source is polymerized. After developing the photoresist material to remove the non-polymerized photoresist, a solution of nitric and HF acid is applied to remove the material which had been underlying the non-polymerized photoresist. The polymerized photoresist and underlying material remain.

Semiconductor manufacturing station 50 represents semiconductor-manufacturing equipment capable of emitting light on semiconductor ball 52 for the above-described manufacturing process and other semiconductor manufacturing steps requiring an exposure to a light source. A light source 54 generates a light from a high-pressure mercury lamp. The light from light source 54 is incident to mask pattern generator 56. Computer 58 stores the desired mask pattern or image that is to be exposed on semiconductor ball 52. The mask pattern defines those areas on the surface of semiconductor ball 52 which are to be exposed to light and those areas, which are not to be exposed to light. The mask pattern can have many sizes, shapes, patterns, and details depending on the desired devices to be formed and disposed on the surface of semiconductor ball 52.

Mask pattern controller 60 receives commands from computer 58 according to the desired mask pattern. Mask pattern generator 56, which can be implemented as a digital mirror device (DMD), receives control signals from computer 58 to program the mask pattern. Further description of mask pattern generator 56 is disclosed in U.S. Pat. No. 6,251,550 and incorporated herein by reference. In the present example, mask pattern generator 56 includes a matrix of 600×600 individually controlled mirrors, each approximately 10 mm×10 mm. Mask pattern controller 60 converts to the desired mask pattern received from computer 58 to a series of control signals sent to each mirror of mask pattern generator 56 to individually program its angle and orientation. Thus, certain mirrors of mask pattern generator 56 are tilted to transmit light to lens 62 for those areas, which are intended to be exposed to light according to the mask pattern. The light image from mask pattern generator 56 passes through lens 62, which focuses the light image on the surface of semiconductor ball 52 centered at focal point 66. In an alternate embodiment, a transmission-type liquid crystal display may be used to emit or transmit light according to the desired mask pattern.

Computer 58 is capable of storing multiple mask patterns. Mask pattern controller 60 can readily re-configure mask pattern generator 56 according to the desired mask pattern.

Semiconductor ball 52 is attached to shaft or armature 68 by a suction cup or other attachment mechanism. Shaft 68 is connected to rotational motor 72. Computer 58 provides control signals to rotational motor 72 that generates rotational torque along shaft 68 to spin semiconductor ball 52 in either direction on axis X. As semiconductor ball 52 rotates on its axis X, the light has a continuous focal exposure completely around the circumference of the sphere defined by line 74.

Figure 3:
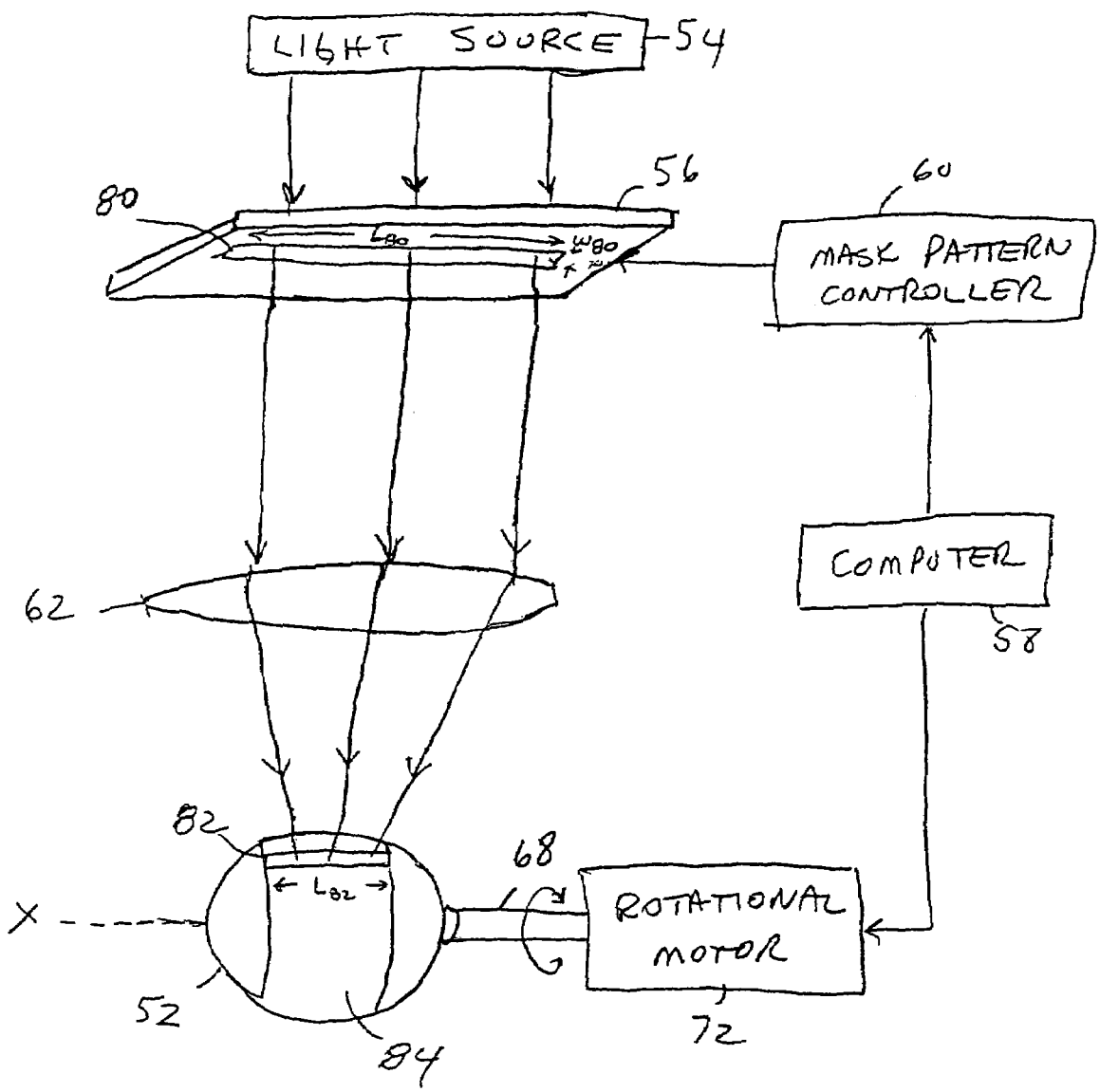
FIG. 3 illustrates further detail of the semiconductor manufacturing system of FIG. 2.

Turning to FIG. 3, further detail of mask pattern generator 56 is shown with exposure contour 80 defining the active surface area of the mask pattern generator. Elements having the same reference number as used in FIG. 2 have a similar function. Exposure contour 80 can be one mirror or transmitting pixel in width, or many mirrors or pixels in width. Each mirror is about 17.0 microns square. In the present example, exposure contour 80 has length $L_{80}$=10.0 mm and width $W_{80}$=2.0 mm. Exposure contour 80 is projected through lens 62 onto the surface of semiconductor ball 52 as exposure contour 82 having length $L_{82}$.

Computer 58 configures mask pattern controller 60 with a portion of the overall mask pattern image corresponding to exposure contour 80. The mask pattern images include patterns of the desired devices to be formed and disposed on the surface of semiconductor ball 52. Assume the overall mask pattern image is a rectangular area having a length $L_{80}$ and a width much greater than $W_{80}$. Computer 58 configures mask pattern controller 60 to scroll the overall mask pattern image across exposure contour 80. In another perspective, exposure contour 80 scans across the mask pattern image.

At time t1, a first mirror or pixel row of length $L_{80}$ of exposure contour 80 is programmed with a first row of the mask pattern image. A second mirror or pixel row of length $L_{80}$ of exposure contour 80 is programmed with a second row of the mask pattern image, and a third mirror or pixel row of length $L_{80}$ of exposure contour 80 is programmed with a third row of the mask pattern image. The first, second, and third mirror or pixel rows of exposure contour 80 are projected through lens 62 onto the surface of semiconductor ball 52. At time t2, the third mirror or pixel row of exposure contour 80 is programmed with a fourth row of the mask pattern image. The third row of the mask pattern generator is shifted to the second mirror or pixel row of exposure contour 80, and the second row of the mask pattern generator is shifted to the first mirror or pixel row of exposure contour 80. The first, second, and third mirror or pixel rows of exposure contour 80 are projected through lens 62 onto the surface of semiconductor ball 52. At time t3, the third mirror or pixel row of exposure contour 80 is programmed with a fifth row of the mask pattern image. The fourth row of the mask pattern generator is shifted to the second mirror or pixel row of exposure contour 80, and the third row of the mask pattern generator is shifted to the first mirror or pixel row of exposure contour 80. The first, second, and third mirror or pixel rows of exposure contour 80 are projected through lens 62 onto the surface of semiconductor ball 52. The process continues across the mask pattern image as it undergoes temporal changes while scrolling across exposure contour 80 to collectively represent an image.

Computer 58 synchronizes the rotation of shaft 68 and semiconductor ball 52 in relation to, and to coincide with, the shifting mask pattern of exposure contour 80 projected as exposure contour 82 on the sphere. The mask pattern image is projected onto the moving surface of semiconductor ball 52 and plays as a continuous real-time video projection of the mask pattern on the surface of the sphere. The length of exposure contour 80 and focal properties of lens 62 are selected such that the length $L_{82}$ of exposure contour 82 provides a sharp and clear continuous projection of the mask pattern on the curved surface of semiconductor ball 52 without any appreciable distortion or degradation of the image, or at least acceptable distortion depending on the application, on the curved surface. A mask pattern image can be projected around the entire circumference of semiconductor ball 52, shown as surface area 84, to circumscribe the sphere without realignment and without any appreciable distortion or degradation of the image over the designated curved surface. The extended projection area is beneficial when forming long devices such as inductors.

The length $L_{82}$ depends in part on the required resolution and allowable distortion in the mask pattern. The mask pattern can be arranged so that high precision devices are located near the center of exposure contour 82 and low precision devices are positioned nearer the outer boundary of surface area 84.

Figure 4A:
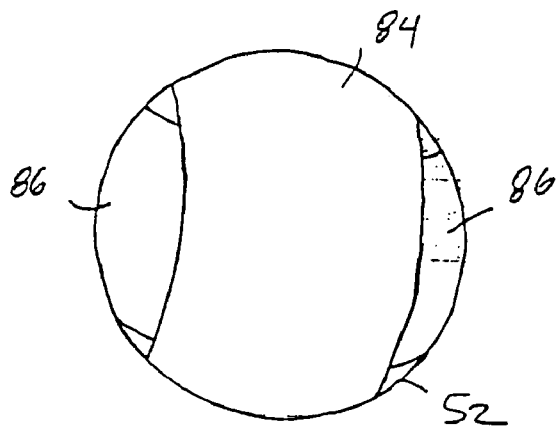
FIGS. 4a–4b illustrate exposures of multiple surface areas of the semiconductor ball.
Figure 4B:
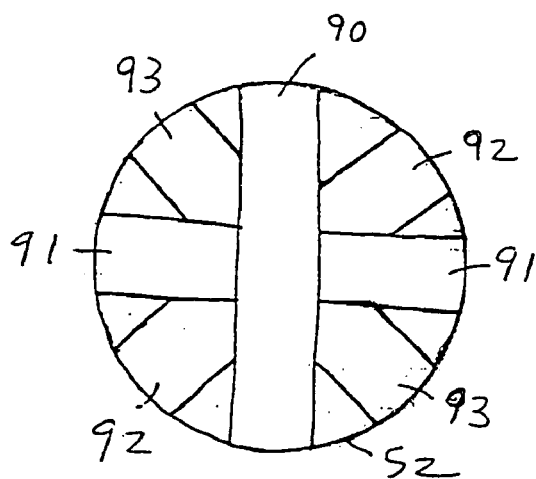

To cover other surface areas, semiconductor ball 52 is rotated with respect to shaft 68 and the projection process is repeated. For example, as shown in FIG. 4a, surface area 84 is exposed around the circumference of semiconductor ball 52 during a first exposure. Semiconductor ball 52 is rotated 90 degrees with respect to shaft 68 and realigned. The projection process is repeated to expose surface area 86 although a portion of the mask pattern is blanked so as to not overlap exposed area 84. FIG. 4b shows the same concept with four non-overlapping exposure areas 90, 91, 92, and 93. For each exposure area, semiconductor ball 52 is rotated 45 degrees and realigned for the exposure process. The narrower the exposure area, the higher resolution the mask pattern and higher precision devices that can be formed. However, more exposure areas involved more manufacturing steps to completely cover the semiconductor ball.

One advantage of the continuous shifting projection of the mask pattern is that if a mirror or pixel of mask pattern generator 56 is defective, the adjacent mirrors or pixels in the same column of exposure contour 80 will cover or help fill in the missing portions of the pattern as the respective row of the mask pattern image shifts to the adjacent row of exposure contour 80.

Another advantage of the exposure process described herein is related to the intensity of the light incident to the surface of semiconductor ball 52. As described in the Background of the Invention, for a curved surface, the light intensity decreases, as the angle of incident becomes less than 90 degrees. In the etching process, the photoresist will polymerize at a rate determined by the intensity of the light exposure. Thus, a uniform intensity exposure is desirable.

Figure 5A:
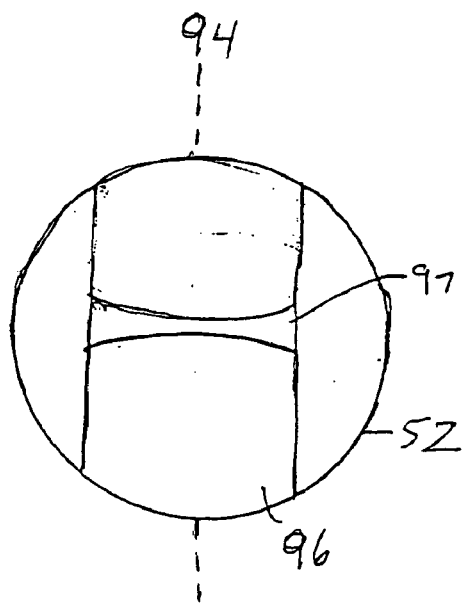
FIGS. 5a–5b illustrate options for various shapes of the active exposure contour on the semiconductor ball.

By rotating semiconductor ball 52 under the light source, the light intensity is uniform at least around the circumference of the sphere for each relative distance from centerline 94 of exposure area 96 shown in FIG. 5a. However, due to the spherical shape of semiconductor ball 52, there is still some difference in light intensity incident to the surface moving across exposure area 96. The light intensity decreases as it moves away from centerline 94. To compensate for the decrease in light intensity moving away from centerline 94, exposure contour 97 is made progressively wider moving toward its edge as shown in FIG. 5a. The additional width of exposure contour 97 moving away from centerline 94 provides a longer exposure time for those areas receiving a lower light intensity. The varying width of exposure contour 97 is determined by integrating the decrease in light intensity. The closer to the edge of exposure contour 97 and the lower the light intensity, the longer exposure time. The net effect is a substantially uniform light intensity across the width of exposure area 96 and around the circumference of the sphere.

Figure 5B:
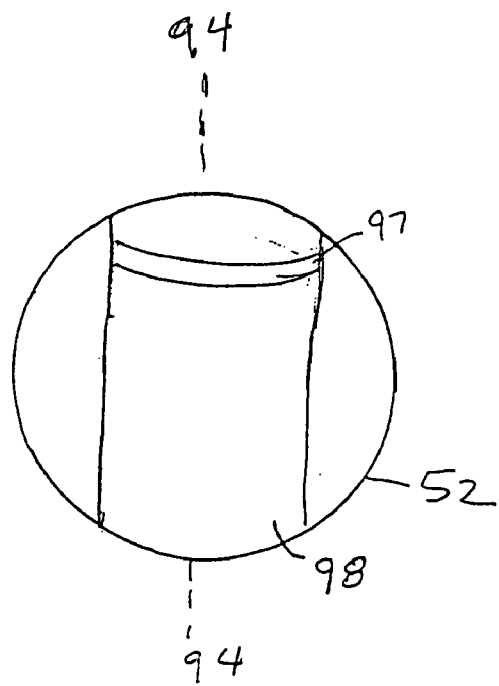

Another problem noted in the Background of the Invention is the tendency of the image to blur and become distorted moving away from centerline 94 as shown in FIG. 5b. To compensate for the distortion, the exposure contour 97 is curved across exposure area 98 in opposition to the curvature of the surface of semiconductor ball 52 as shown in FIG. 5b. By this compensation, the entire length of the exposure contour has the same focal point.

Figure 6A:
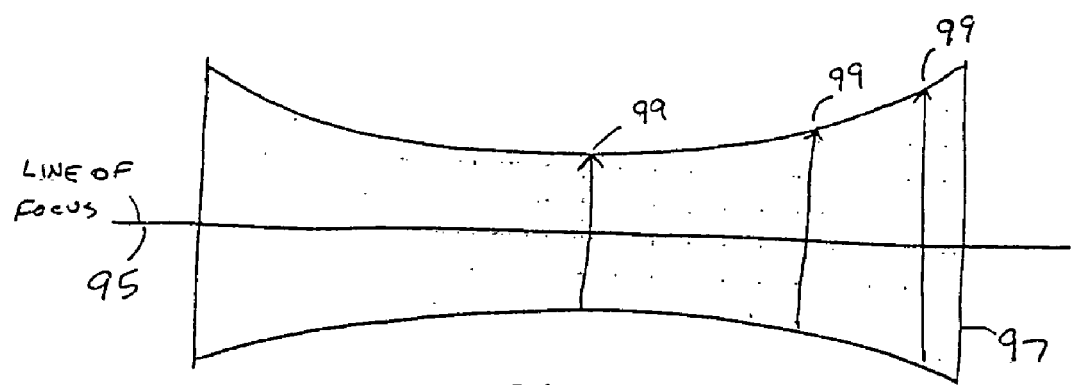
FIGS. 6a–6b illustrate further detail of the active exposure contours on the semiconductor ball.
Figure 6B:
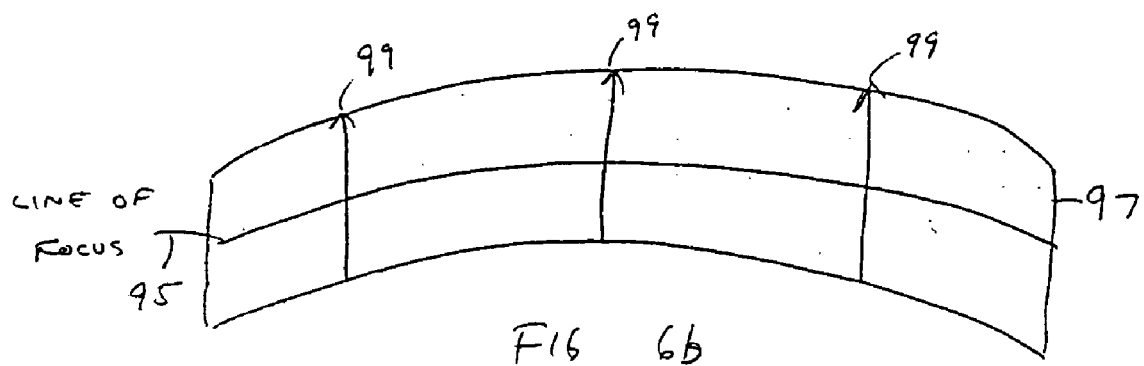

Further detail of exposure contour 97 is shown in FIGS. 6a and 6b. The shape of exposure contour 97 is selected such that all positions along line of focus 95 have the same quantity of light 99.

Figure 7:
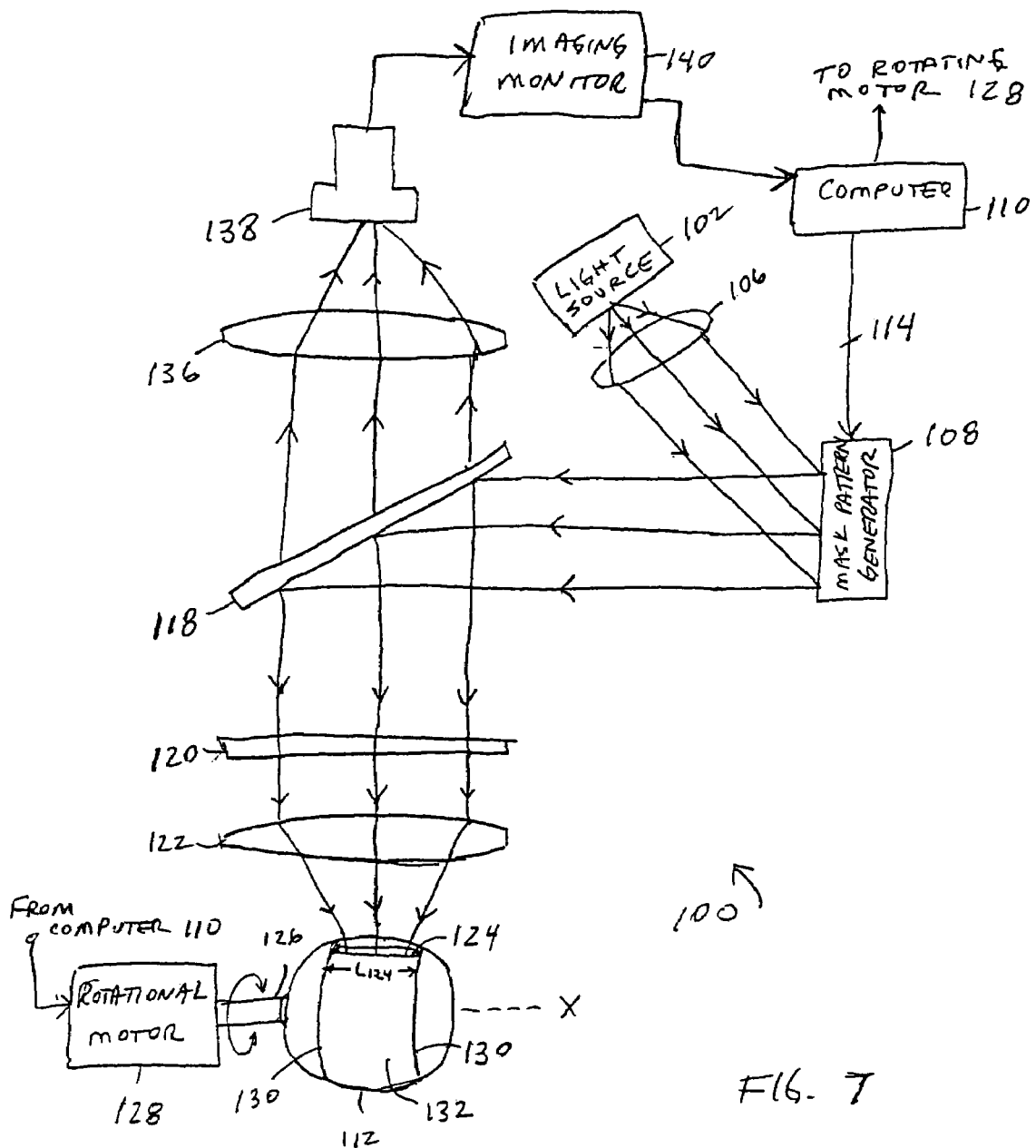
FIG. 7 is an alternate embodiment of the semiconductor manufacturing system.
Figure 1:
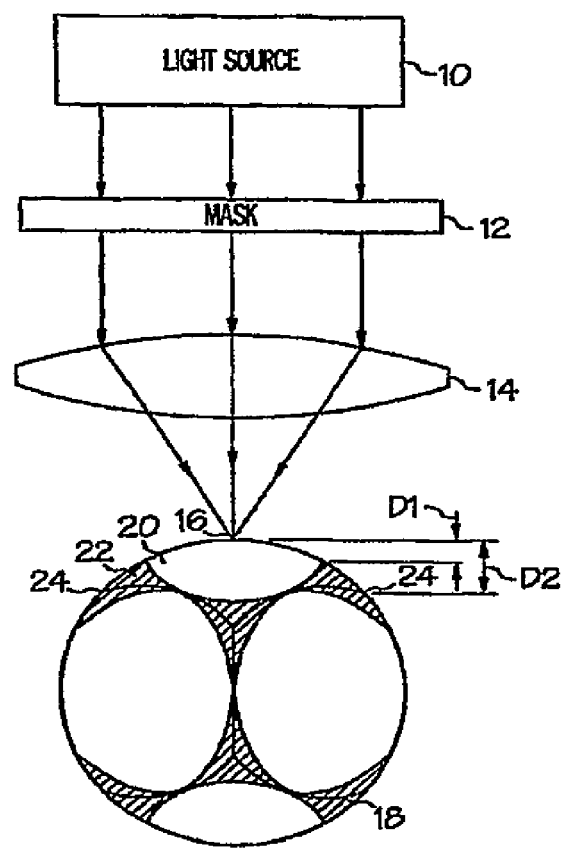
Figure 2:
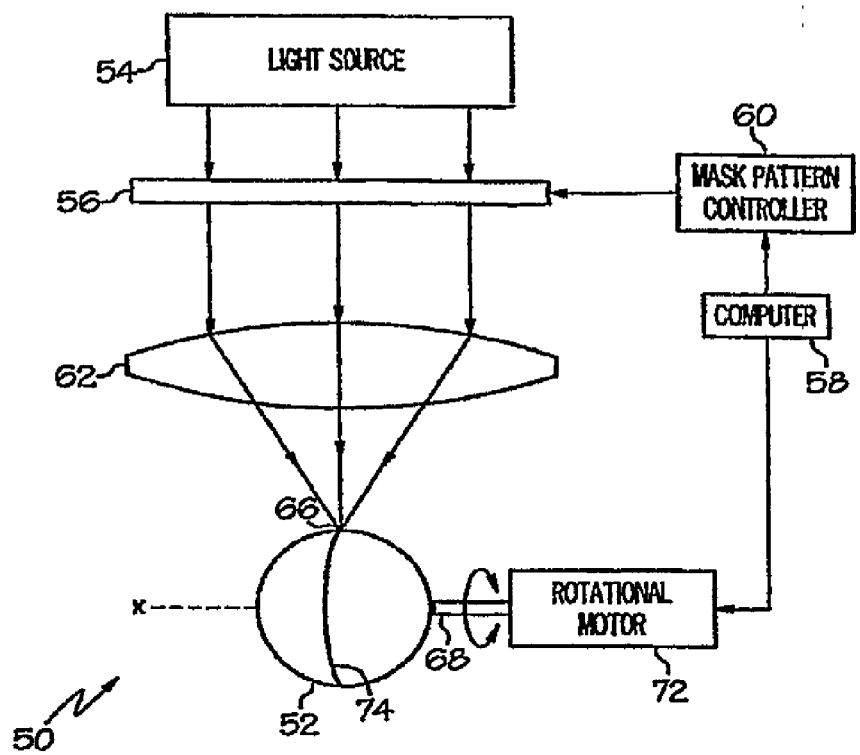
Figure 3:
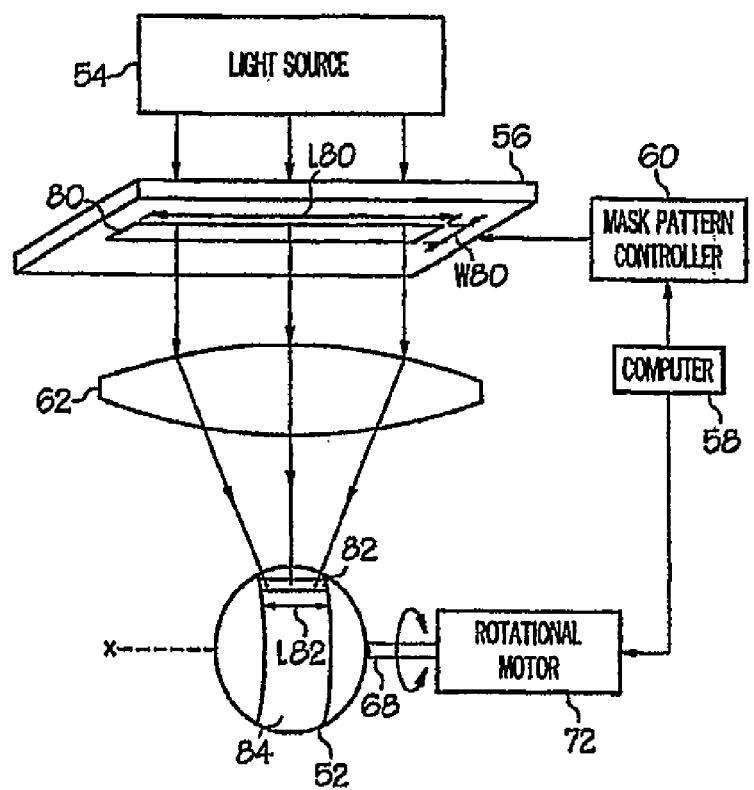
Figure 4A:
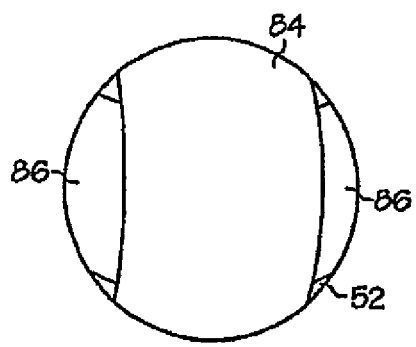
Figure 4B:
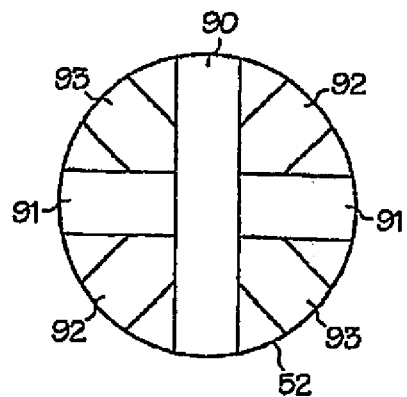
Figure 5A:
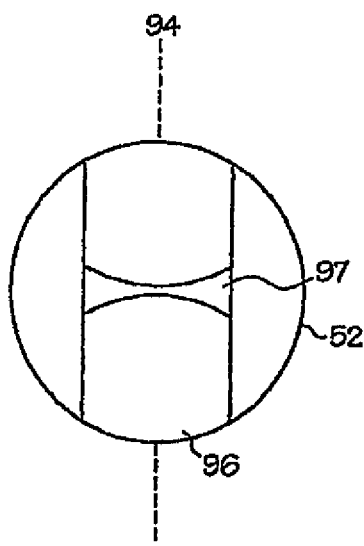
Figure 5B:
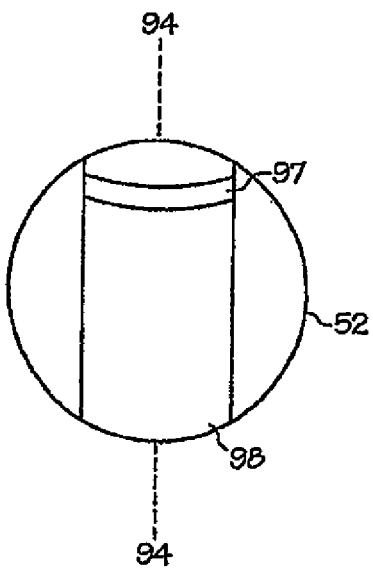
Figure 6A:
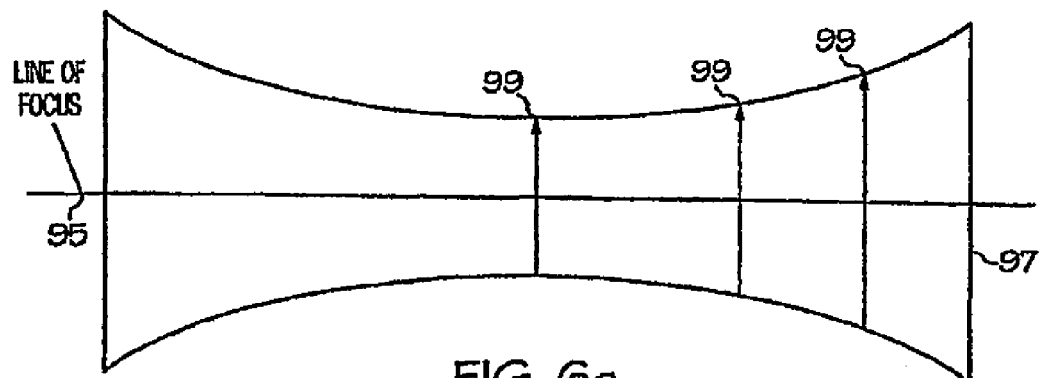
Figure 6B:
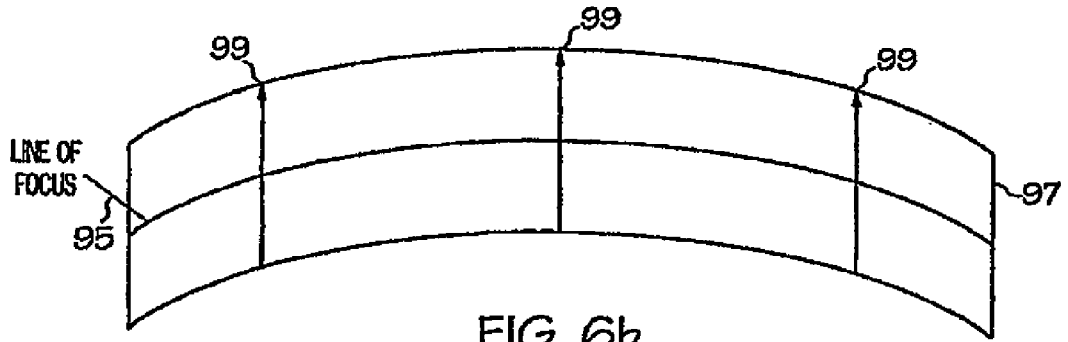
Figure 7:
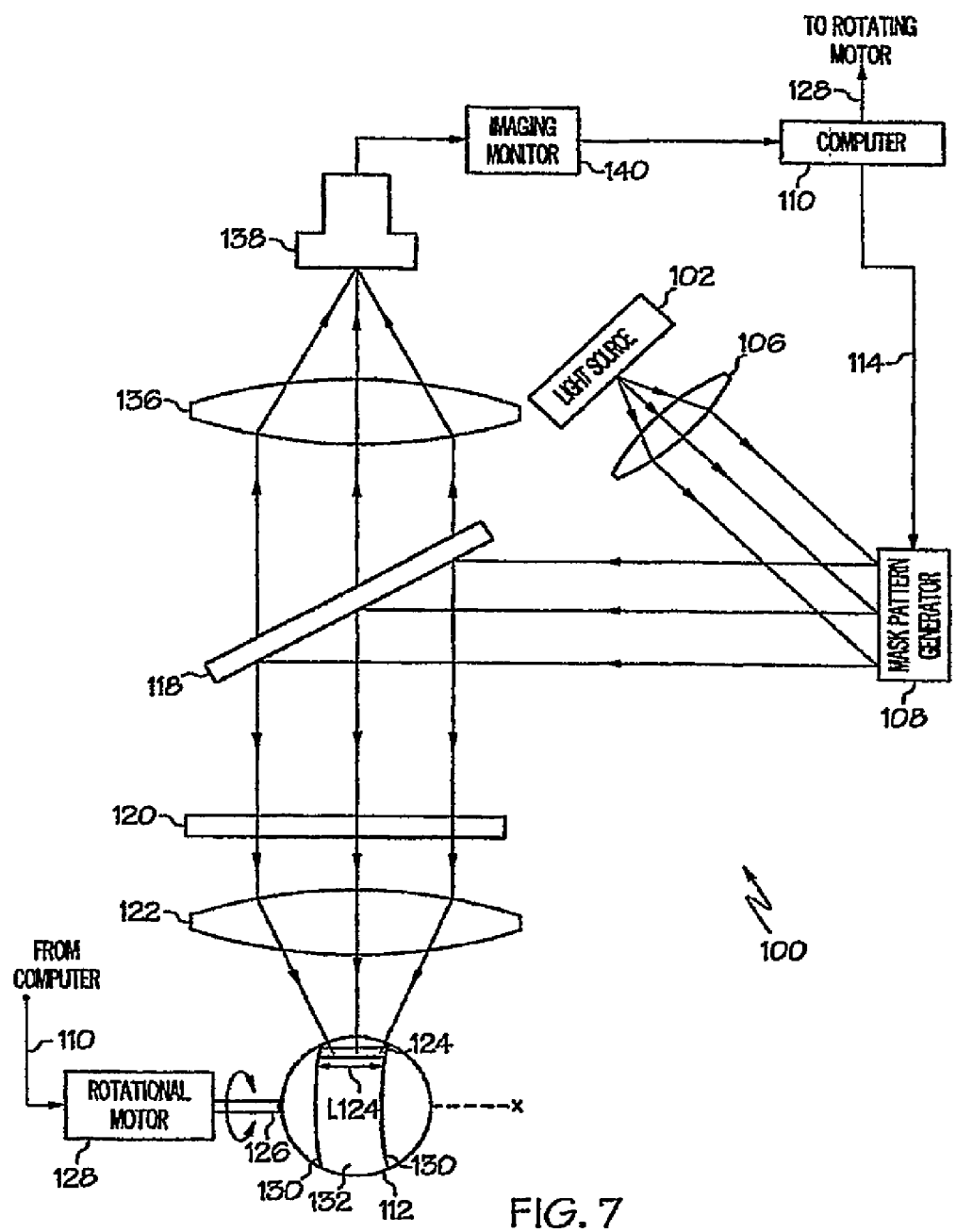

An alternate embodiment of the semiconductor manufacturing station is shown in FIG. 7. Semiconductor manufacturing station 100 includes a light source 102 for generating a light. The light from light source 102 is focused by lens 106 and projected onto mask pattern generator 108. Computer 110 stores the desired mask pattern or image that is to be exposed on semiconductor ball 112. Mask pattern generator 108 receives control signals on conductors 114 from computer 110 to program the mask pattern. The active area of mask pattern generator 108 is an exposure contour (not shown) similar to exposure contour 80 in FIG. 3. The light image from mask pattern generator 108 is reflected by mirror 118 and passes through stop ring 120. Stop ring 120 is a diaphragm for controlling focal depth. Lens 122 then focuses the light image on exposure contour 124 on the surface of semiconductor ball 112.

Semiconductor ball 112 is attached to shaft or armature 126 by a suction cup or other attachment mechanism. Shaft 126 is connected to rotational motor 128. Computer 110 provides control signals to rotational motor 128 that generates rotational torque along shaft 126 to spin semiconductor ball 112 in either direction on axis X. As semiconductor ball 112 rotates on its axis X, the light has a continuous focal exposure completely around the circumference of the sphere defined by lines 130.

Computer 110 controls mask pattern generator 108 to scroll the overall mask pattern across the active exposure contour area as described above. The mask pattern is projected on exposure contour 124 of the surface of semiconductor ball 112. The mask pattern generator provides a pattern of light, which undergoes temporal changes to collectively represent an image. Computer 110 synchronizes the rotation of shaft 126 and semiconductor ball 112 in relation to, and to coincide with, the shifting mask pattern projected as exposure contour 124 on the sphere. The mask pattern image is projected onto the moving surface of semiconductor ball 112 which plays as a continuous real-time video projection of the mask pattern on the surface of the sphere. The length of the active exposure contour of mask pattern generator 108 and focal properties of lens 122 are selected such that the length $L_{124}$ of exposure contour 124 provides a sharp and clear continuous projection of the mask pattern on the curved surface of semiconductor ball 112 without any appreciable distortion or degradation of the image on the curved surface. A mask pattern image can be projected around the entire circumference of semiconductor ball 112, shown as surface area 132, without realignment of the sphere and without any appreciable distortion or degradation of the image over entire curved surface.

The mask pattern image across exposure contour 124 is also reflected back through lens 122, stop ring 120, mirror 118, and lens 140 to imaging receiver 138, also known as a charge coupled device (CCD). Imaging receiver 138 converts the reflect image of exposure contour 124 to electrical signals. The electrical signals are sent to imaging monitor 140 for display and further to computer 110 for processing. Imaging receiver 138 and imaging monitor 140 are utilized in an alignment process as described in copending U.S. patent application entitled "System and Method for Detecting and Correcting Position Deviations of an Object having a Curved Surface", U.S. patent application Ser. No. 10/538, 978.

In summary, a semiconductor manufacturing station exposes light on a surface area of a spherical semiconductor device. A mask pattern generator provides a pattern of light, which undergoes temporal changes to collectively represent an image. The mask pattern generator has an active exposure contour, which provides a portion of the overall image. The pattern of light is directed though a lens to the surface area of the semiconductor device. The semiconductor device rotates in relation to the temporal changes in the pattern of light to expose the pattern of light over a portion of a surface area of the semiconductor device. A computer synchronizes the rotation of the shaft and the semiconductor device in relation to, and to coincide with, the shifting mask pattern of the active exposure contour projected on the sphere. A mask pattern image can be projected around the entire circumference of the semiconductor device to circumscribe the sphere without realignment and without any appreciable distortion or degradation of the image over entire curved surface.

Although the present invention has been described with respect to preferred embodiments, any person skilled in the art will recognize that changes may be that changes be made in form and detail, and equivalents may be substituted for elements of the invention without departing from the spirit and scope of the invention. Many modifications may be made to adapt to a particular situation or material to the teaching of the invention without departing from the essential scope of the invention. Therefore, it is intended that the invention not be limited to the particular embodiments disclosed for carrying out this invention, but that the invention will include all embodiments falling within the scope of the appended claims.

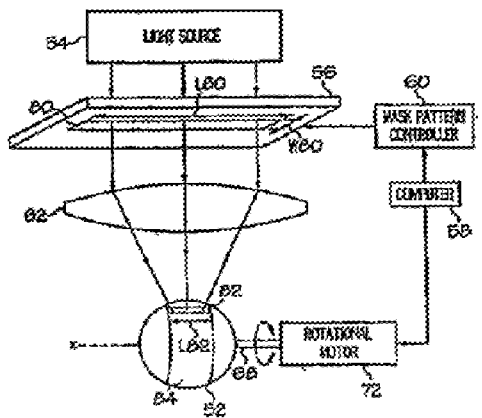

What is claimed is:

1. An optical apparatus for exposing light on a surface of a spherical semiconductor device, comprising:
   a mask for providing a pattern of light through an exposure contour which undergoes temporal changes to collectively represent an image, the exposure contour being curved in opposition to a curvature of the surface of the spherical semiconductor device;
   a lens positioned to focus the pattern of light along a focal line across the surface of the spherical semiconductor device, wherein the exposure contour has a first width in a middle region of the focal line and is made progressively wider than the first width in both directions orthogonal to the focal line toward each end of the focal line to increase exposure time and achieve a substantially uniform intensity exposure across the curvature of the spherical semiconductor device; and
   a motor having a shaft coupled to the spherical semiconductor device for rotating the spherical semiconductor device in relation to the temporal changes in the pattern of light to expose the pattern of light over a portion of the surface of the spherical semiconductor device.

2. The optical apparatus of claim 1, wherein a first exposed portion of the surface of the spherical semiconductor device has a width and circumscribes the spherical semiconductor device.

3. The optical apparatus of claim 2, wherein a second exposed portion of the surface of the spherical semiconductor device has a width and is non-overlapping with respect to the first exposed portion of the surface of the spherical semiconductor device.

4. The optical apparatus of claim 1, wherein the mask includes a mask pattern generator having an active exposure contour for providing the pattern of light.

5. The optical apparatus of claim 4, wherein the mask pattern generator comprises a digital mirror device.

6. The optical apparatus of claim 4, wherein the mask further includes a mask pattern controller operating in response to control signals and providing a portion of a mask pattern to the active exposure contour of the mask pattern generator.

7. A method of exposing light on a surface of a spherical semiconductor device, comprising:
 providing a pattern of light through an exposure contour of a mask which undergoes temporal changes to collectively represent an image;
 directing the pattern of light along a focal line across the surface of the spherical semiconductor device, wherein the exposure contour has a first width in a middle region of the focal line and is made progressively wider than the first width toward each end of the focal line to increase exposure time and achieve a substantially uniform intensity exposure across a curvature of the spherical semiconductor device; and
 rotating the spherical semiconductor device in relation to the temporal changes in the pattern of light to expose the pattern of light over a portion of the surface of the spherical semiconductor device.

8. The method of claim 7, further including the step of providing a first exposed portion of the surface of the spherical semiconductor device having a width and circumscribing the spherical semiconductor device.

9. The method of claim 8, further including the step of providing a second exposed portion of the surface of the spherical semiconductor device having a width and non-overlapping with respect to the first exposed portion of the surface of the spherical semiconductor device.

10. The method of claim 7, wherein the exposure contour is curved in opposition to a curvature of the surface of the spherical semiconductor device.

11. The method of claim 7, wherein the mask includes a mask pattern generator having an active exposure contour for providing the pattern of light.

12. The method of claim 11, wherein the mask pattern generator comprises a digital mirror device.

13. A method of manufacturing a semiconductor device having a curved surface, comprising:
 providing a pattern of light through an exposure contour of a mask which undergoes temporal changes to collectively represent an image;
 directing the pattern of light along a focal line across the curved surface of the semiconductor device, wherein the exposure contour has a first width in a middle region of the focal line and is made progressively wider than the first width toward each end of the focal line to increase exposure time and achieve a substantially uniform intensity exposure across the curved surface of the semiconductor device; and
 rotating the semiconductor device in relation to the temporal changes in the pattern of light to expose the pattern of light over a portion of the curved surface of the semiconductor device.

14. The method of claim 13, wherein the semiconductor device is a spherical semiconductor device.

15. The method of claim 14, further including the step of providing a first exposed portion of the curved surface of the semiconductor device having a width and circumscribing the semiconductor device.

16. The method of claim 15, further including the step of providing a second exposed portion of the curved surface of the semiconductor device having a width and non-overlapping with respect to the first exposed portion of the curved surface of the semiconductor device.

17. The method of claim 13, wherein the exposure contour is curved in opposition to the curved surface of the semiconductor device.

18. A method of exposing light on a semiconductor device having a curved surface, comprising:
 generating a pattern of light through an exposure contour of a mask;
 directing the pattern of light along a focal line across the curved surface of the semiconductor device, wherein the exposure contour has a first width in a middle region of the focal line and is made progressively wider than the first width toward each end of the focal line to increase exposure time and achieve a substantially uniform intensity exposure across the curved surface of the semiconductor device; and
 rotating the semiconductor device to expose the pattern of light over a portion of the curved surface of the semiconductor device.

19. The method of claim 18, wherein the semiconductor device is a spherical semiconductor device.

20. The method of claim 18, wherein a first exposed portion of the curved surface of the semiconductor device has a width and circumscribes the semiconductor device.

21. The method of claim 20, wherein a second exposed portion of the curved surface of the semiconductor device has a width and is non-overlapping with respect to the first exposed portion of the curved surface of the semiconductor device.

22. The method of claim 18, wherein the exposure contour is curved in opposition to the curved surface of the semiconductor device.

* * * * *

UNITED STATES PATENT AND TRADEMARK OFFICE
CERTIFICATE OF CORRECTION

| | | |
|---|---|---|
| PATENT NO. | : 7,145,633 B2 | |
| APPLICATION NO. | : 10/538980 | |
| DATED | : December 5, 2006 | |
| INVENTOR(S) | : Nishimoto et al. | |

It is certified that error appears in the above-identified patent and that said Letters Patent is hereby corrected as shown below:

Delete Title page illustrating a figure, and substitute therefor, new Title page illustrating a figure. (attached)

Delete drawing sheets 1-6, and substitute therefor drawing sheets 1-6. (attached0

Signed and Sealed this

Third Day of April, 2007

JON W. DUDAS
*Director of the United States Patent and Trademark Office*

United States Patent
Nishimoto et al.

(12) 
(10) Patent No.: US 7,145,633 B2
(45) Date of Patent: Dec. 5, 2006

(54) APPARATUS AND METHOD OF EXPOSING LIGHT TO A SEMICONDUCTOR DEVICE HAVING A CURVED SURFACE

(75) Inventors: Ikuo Nishimoto, Kanagawa (JP); Nobuo Takeda, Miyagi (JP); Ichitaroh Satoh, Tokyo (JP)

(73) Assignee: Yamatake Corporation, Tokyo (JP)

( * ) Notice: Subject to any disclaimer, the term of this patent is extended or adjusted under 35 U.S.C. 154(b) by 0 days.

(21) Appl. No.: 10/538,980

(22) PCT Filed: Jan. 9, 2003

(86) PCT No.: PCT/US03/00579

§ 371 (c)(1),
(2), (4) Date: Jun. 14, 2005

(87) PCT Pub. No.: WO2004/063813

PCT Pub. Date: Jul. 29, 2004

(65) Prior Publication Data
US 2006/0050343 A1  Mar. 9, 2006

(51) Int. Cl.
G03B 27/58 (2006.01)
G03B 27/48 (2006.01)
G03B 27/32 (2006.01)
G03F 1/00 (2006.01)
G03C 5/00 (2006.01)
G06F 19/00 (2006.01)

(52) U.S. Cl. .............. 355/47; 355/48; 355/72; 355/77; 430/5; 430/311; 700/121

(58) Field of Classification Search .............. 355/47, 355/48, 49, 53, 72, 77; 430/5, 311; 700/121
See application file for complete search history.

(56) References Cited

U.S. PATENT DOCUMENTS

| | | | |
|---|---|---|---|
| 3,573,045 A | 3/1971 | Lemelson | |
| 4,102,734 A | 7/1978 | Schiffman | |
| 5,953,776 A | 9/1999 | Ishikawa | |
| 6,027,853 A * | 2/2000 | Donadio, III | 430/320 |
| 6,061,118 A | 5/2000 | Takeda | |
| 6,069,682 A | 5/2000 | Ishikawa | |
| 6,097,472 A | 8/2000 | Takanaka et al. | |
| 6,130,742 A | 10/2000 | Kanatake | |
| 6,136,617 A | 10/2000 | Kanatake | |
| 6,245,630 B1 | 6/2001 | Ishikawa | |
| 6,251,550 B1 | 6/2001 | Ishikawa | |
| 6,251,765 B1 | 6/2001 | Fukano et al. | |
| 6,265,234 B1 | 7/2001 | Mei | |
| 6,300,020 B1 | 10/2001 | Ina et al. | |

(Continued)

*Primary Examiner*—Alan Mathews
(74) *Attorney, Agent, or Firm*—Robert D. Atkins; Quarles & Brady Streich Lang LLP

(57) ABSTRACT

A semiconductor manufacturing station (50) exposes light on a surface area of a spherical semiconductor device or ball (52). A mask pattern generator (56) provides a pattern of light, which undergoes temporal changes to collectively represent an image. The mask pattern generator has an active exposure contour (80) that provides a portion of the overall image. The pattern of light is directed through a lens (62) to the surface area of the semiconductor device. The semiconductor device rotates in relation to the temporal changes in the pattern of light to expose the pattern of light over a portion of a surface area of the semiconductor device. The exposure contour has a narrower center and becomes wider moving away from the center. The exposure contour may have a curvature.

22 Claims, 6 Drawing Sheets